US008671233B2

(12) United States Patent
Danilak

(10) Patent No.: US 8,671,233 B2
(45) Date of Patent: *Mar. 11, 2014

(54) TECHNIQUES FOR REDUCING MEMORY WRITE OPERATIONS USING COALESCING MEMORY BUFFERS AND DIFFERENCE INFORMATION

(71) Applicant: LSI Corporation, San Jose, CA (US)

(72) Inventor: Radoslav Danilak, Cupertino, CA (US)

(73) Assignee: LSI Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/840,609

(22) Filed: Mar. 15, 2013

(65) Prior Publication Data

US 2013/0212322 A1 Aug. 15, 2013

Related U.S. Application Data

(63) Continuation of application No. 13/042,231, filed on Mar. 7, 2011, now Pat. No. 8,402,184, which is a continuation of application No. 11/852,104, filed on Sep. 7, 2007, now Pat. No. 7,904,619.

(60) Provisional application No. 60/878,242, filed on Jan. 3, 2007, provisional application No. 60/860,843, filed on Nov. 24, 2006.

(51) Int. Cl.
G06F 12/02 (2006.01)

(52) U.S. Cl.
USPC ............ 710/56; 711/103; 711/154; 711/156; 711/165; 711/170; 711/E12.001; 711/E12.008; 711/E12.009; 710/52; 710/54; 710/57

(58) Field of Classification Search
USPC ................ 711/100, 103, 154, 156, 165, 170, 711/E12.008, E12.009; 710/52, 54, 56–57
See application file for complete search history.

(56) References Cited

U.S. PATENT DOCUMENTS

| 5,315,602 | A  | 5/1994 | Noya et al. |
| 5,680,579 | A  | 10/1997 | Young et al. |
| 6,101,615 | A  | 8/2000 | Lyons |
| 6,148,368 | A  | 11/2000 | DeKoning |
| 6,195,727 | B1 | 2/2001 | Islam et al. |

(Continued)

FOREIGN PATENT DOCUMENTS

| JP | H0816328 A | 1/1996 |
| JP | H08235076 A | 9/1996 |

(Continued)

OTHER PUBLICATIONS

September 28, 2013 List of References Used in Art Rejections, 1 pg.

(Continued)

Primary Examiner — Jasmine Song
(74) Attorney, Agent, or Firm — PatentVentures: Bennett Smith; Korbin Van Dyke

(57) ABSTRACT

Techniques are described for reducing write operations in memory. In use, write operations to be performed on data stored in memory are identified. A difference is then determined between results of the write operations and the data stored in the memory. Difference information is stored in coalescing memory buffers. To this end, the write operations may be reduced, utilizing the difference information.

18 Claims, 12 Drawing Sheets

(56) References Cited

U.S. PATENT DOCUMENTS

| | | |
|---|---|---|
| 6,219,750 B1 | 4/2001 | Kanamaru et al. |
| 6,256,232 B1 * | 7/2001 | Chang et al. ............ 365/185.33 |
| 6,298,415 B1 | 10/2001 | Riedle |
| 6,651,137 B2 | 11/2003 | Baek et al. |
| 6,724,678 B2 | 4/2004 | Yoshimura |
| 6,754,767 B2 | 6/2004 | Gold |
| 7,353,423 B2 | 4/2008 | Hartline et al. |
| 7,529,970 B2 | 5/2009 | Hartline et al. |
| 7,669,107 B2 | 2/2010 | Forhan et al. |
| 7,774,542 B2 | 8/2010 | Zhang et al. |
| 2002/0091903 A1 | 7/2002 | Mizuno |
| 2003/0084397 A1 | 5/2003 | Peleg |
| 2004/0153961 A1 | 8/2004 | Park et al. |
| 2004/0268037 A1 | 12/2004 | Buchanan et al. |
| 2005/0050381 A1 | 3/2005 | Maddock |
| 2005/0108594 A1 | 5/2005 | Menon et al. |
| 2005/0132212 A1 | 6/2005 | Haswell |
| 2005/0160218 A1 | 7/2005 | See et al. |
| 2006/0080515 A1 | 4/2006 | Spiers et al. |
| 2006/0123200 A1 | 6/2006 | Ito et al. |
| 2006/0206675 A1 | 9/2006 | Sato et al. |
| 2007/0124648 A1 | 5/2007 | Dholakia et al. |
| 2007/0198890 A1 | 8/2007 | Dholakia et al. |
| 2007/0214316 A1 | 9/2007 | Kim |
| 2008/0183963 A1 | 7/2008 | He et al. |
| 2009/0055682 A1 | 2/2009 | Gibson et al. |
| 2009/0271659 A1 | 10/2009 | Troppens et al. |

FOREIGN PATENT DOCUMENTS

| | | |
|---|---|---|
| JP | 2002108571 A | 4/2002 |
| JP | 2002207572 A | 7/2002 |
| JP | 2004227560 A | 8/2004 |
| JP | 2006163474 A | 6/2006 |
| JP | 2006252165 A | 9/2006 |
| JP | 2006252247 A | 9/2006 |
| WO | WO 2006/120679 A2 | 11/2006 |

OTHER PUBLICATIONS

Apr. 16, 2013 "Notice of Final Rejection" issued for (Japanese Application P2009-540232 of PCT/US2007/024294), 4 pages (2 English translation sheets, 2 original Japanese sheets).

May 29, 2012 "Notice of Reasons for Rejection" issued for (Japanese Application P2009-540232 of PCT/US2007/024294), 11 pages (6 English translation sheets, 5 original Japanese sheets).

Nov. 29, 2010 "First Office Action of China State Intellectual Property Office" issued for (Chinese Application 200780044865.6 of PCT/US2007/024294), 12 pages (6 English translation sheets, 6 original Chinese sheets).

International Search Report in the related case PCT/US07/24294, 1 sheet.

International Preliminary Report on Patent Ability in the related case PCT/US07/24294, 10 sheets.

* cited by examiner

TECHNIQUES FOR REDUCING MEMORY WRITE OPERATIONS USING COALESCING MEMORY BUFFERS AND DIFFERENCE INFORMATION

RELATED APPLICATIONS

The present application is a continuation of U.S. non-provisional application Ser. No. 13/042,231, filed Mar. 7, 2011, now U.S. Pat. No. 8,402,184; the foregoing application being a continuation of U.S. non-provisional application Ser. No. 11/852,104, filed Sep. 7, 2007, now U.S. Pat. No. 7,904,619; the foregoing application claiming priority to U.S. provisional application Ser. No. 60/860,843, filed Nov. 24, 2006, and U.S. provisional application Ser. No. 60/878,242, filed Jan. 3, 2007; and wherein all the foregoing applications are incorporated by reference in their entirety for all purposes.

FIELD OF THE INVENTION

The present invention relates to memory, and more particularly to memory having a finite lifetime.

BACKGROUND

Memory is one of the most limiting aspects of performance of modern enterprise computing systems. One limiting aspect of memory is the fact that many types of memory exhibit a limited lifetime. For example, a lifetime of non-volatile memory such as flash is reduced, albeit a small amount, each time it is erased and re-written. Over time and thousands of erasures and re-writes, such flash memory may become less and less reliable.

Thus, depending on the type of use (e.g. light vs. heavy), a lifetime of flash memory may vary widely. This can be problematic in various respects. For instance, flash memory manufacturers are often expected to provide a limited warranty for a specified amount of time. While such warranty may be sufficient for light to typical use of the flash memory, it may require the return and replacement of the flash memory in instances of heavy use (e.g. in an enterprise application, etc.).

Such situations may significantly impact profits of a flash memory manufacturer. In particular, the need to continuously replace warranted flash memory for heavy-use customers can considerably reduce profits derived from the sale of flash memory to light-to-typical-use customers. There is thus a need for addressing these and/or other issues associated with the prior art.

SUMMARY

A system, method, and computer program product are provided for reducing write operations in memory. In use, write operations to be performed on data stored in memory are identified. A difference is then determined between results of the write operations and the data stored in the memory. Difference information associated with the difference is stored in the memory. To this end, the write operations may be reduced, utilizing the difference information.

DETAILED DESCRIPTION

In accordance with different embodiments to be described, various operations that reduce a lifetime of memory may be controlled for the purpose of prolonging such lifetime. In the context of the present description, such operations may refer to a write operation, an erase operation, a program operation, and/or any other operation that is capable of reducing the aforementioned lifetime.

Figure 1:
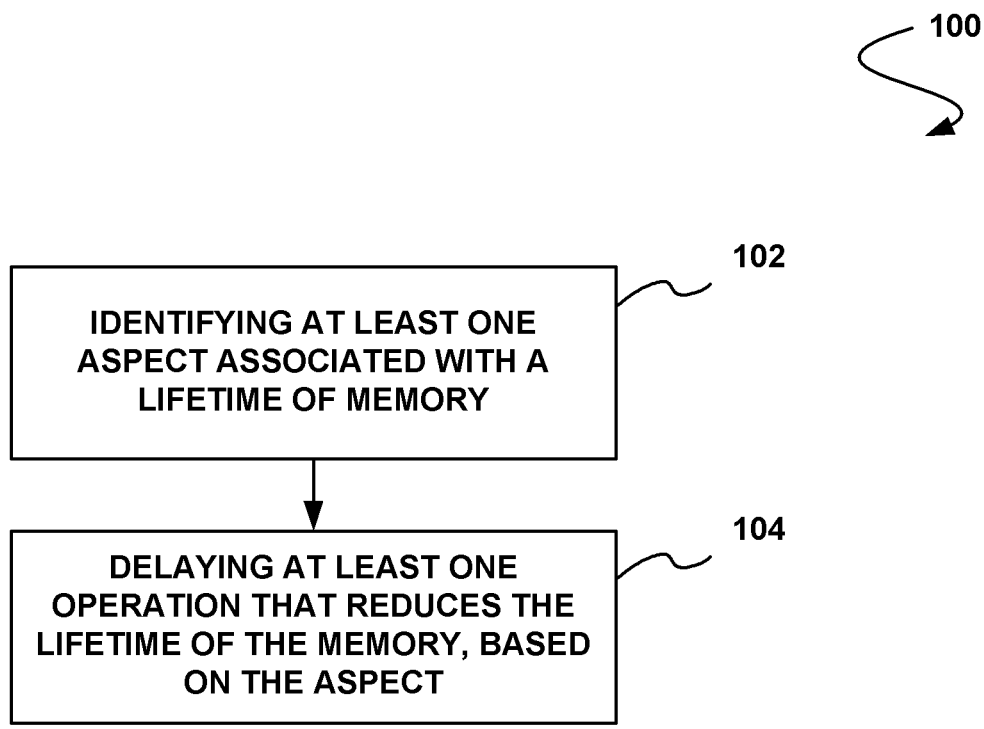
FIG. 1 shows a method for delaying operations that reduce a lifetime of memory, in accordance with one embodiment.

FIG. 1 shows a method 100 for delaying operations that reduce a lifetime of memory, in accordance with one embodiment. As shown, at least one aspect associated with a lifetime of memory is identified. See operation 102.

In the context of the present description, the lifetime of the memory may include any duration during which the memory exhibits any desired degree of usability. For example, in various embodiments, such lifetime may include, but is certainly not limited to a desired lifetime, an actual lifetime, an estimated lifetime, etc. Further, the degree of usability may refer to any usability-related parameter such as a percentage of components (e.g. blocks, cells, etc.) that are still operational, a reliability of the memory or components thereof, and/or any other parameter for that matter.

Also in the context of the present description, the aspect associated with the lifetime that is identified in operation 102 may, in various embodiments, include a period of time, a rate of the operations that reduce the lifetime of the memory, a total permitted number of the operations that reduce the lifetime of the memory, a duration of the lifetime, etc. Moreover, given the aforementioned total permitted number of operations and a selected or desired lifetime, a maximum average rate of operations in units of number of operations per time period can be directly calculated, in one illustrative embodiment. Of course, such exemplary aspects are set forth for illustrative purposes only as absolutely any other aspect of the lifetime may be identified, for reasons that will soon become apparent.

To this end, at least one operation that reduces the lifetime of the memory is delayed, based on the aspect. See operation 104. Such delay may thus be performed in any manner that is at least a partial function of the aspect of the memory lifetime identified in operation 102. In the context of the present description, the aforementioned delay of the operation is deemed to be inclusive of situations where only a portion of the operation is delayed. For example, in situations where an operation may include multiple components, such delay may be applied to one or more (or all) parts of such operation.

In one embodiment, the operation may be delayed by delaying a command that initiates the operation. For example, in response to the identification of a write or erase command, execution of such command may be delayed. Of course, in other embodiments, the operation itself may simply be delayed. By this design, such delay of one or more operations that would otherwise reduce the lifetime of the memory results in a decrease in such reduction, at least in part.

More illustrative information will now be set forth regarding various optional architectures and features with which the foregoing framework may or may not be implemented, per the desires of the user. For example, the delay may be administered in a variety of different ways using a myriad of different techniques, examples of which will now be set forth. It should be strongly noted that the following information is set forth for illustrative purposes and should not be construed as limiting in any manner. Any of the following features may be optionally incorporated with or without the exclusion of other features described.

Figure 2:
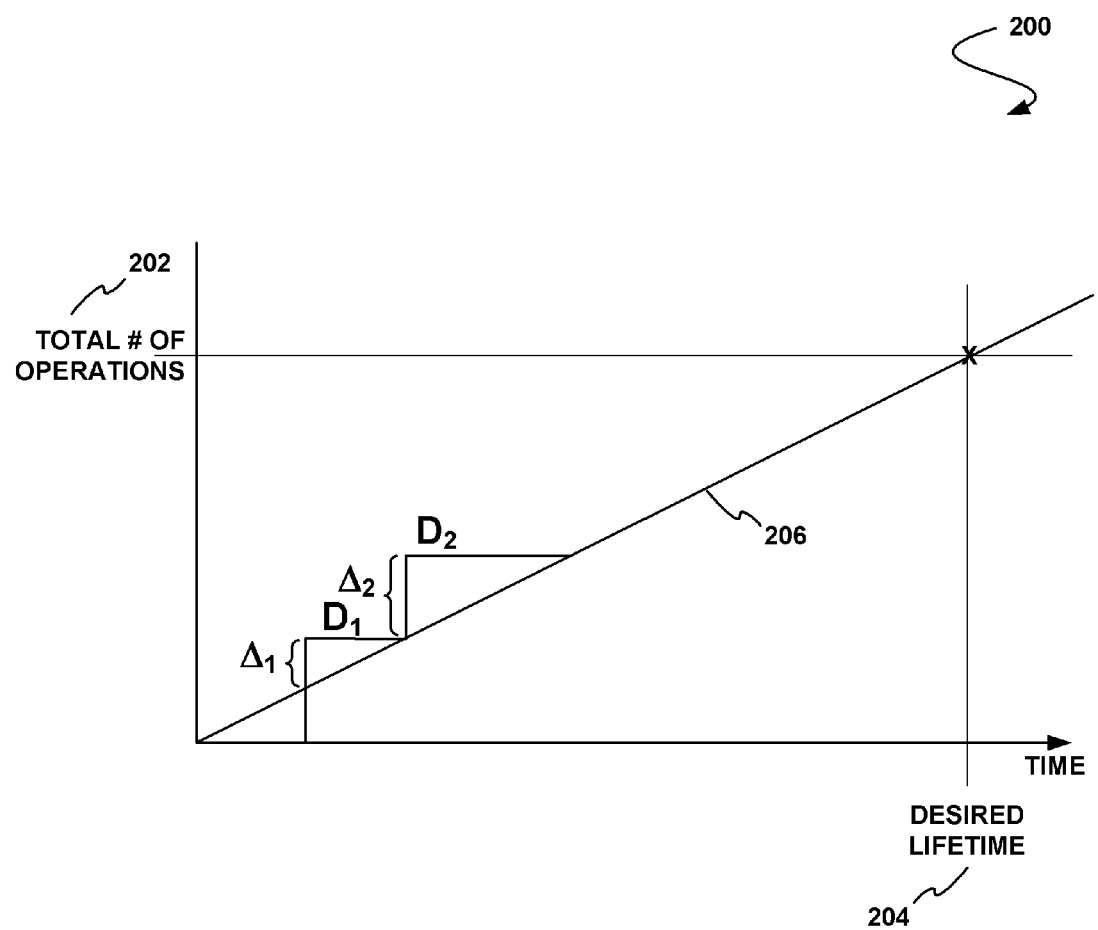
FIG. 2 shows a technique for delaying operations that reduce a lifetime of memory, in accordance with another embodiment.

FIG. 2 shows a technique 200 for delaying operations that reduce a lifetime of memory, in accordance with another embodiment. As an option, the present technique 200 may be implemented to carry out the method 100 of FIG. 1. Of course, however, the technique 200 may be implemented in any desired environment. It should also be noted that the aforementioned definitions may apply during the present description.

As shown, the technique 200 takes into account a total number of operations 202 that result in the memory exhibiting a minimal degree of usability, as well as a minimum desired lifetime 204 of the memory. From such data points, a maximum average operation rate 206 may be calculated that achieves the minimum desired lifetime 204.

In use, a number of lifetime-reducing operations may be monitored as time progresses. If at any time, a number of such operations over time exceeds the maximum average operation rate 206, in the manner shown, any excess operations (that contribute to exceeding the rate) may be delayed by a calculated amount, by a predetermined amount of time, or adaptively based on prior or predicted rates of lifetime-reducing operations. Such predetermined amount of time may, in one embodiment, be a time that results in the maximum average operation rate 206 not being exceeded.

In various embodiments, the determination as to which operations are to be subjected to the delay (as well as the length of the delay itself) may be based on a variety of factors. For example, in one embodiment, the delaying may be based on an application that initiates the operation. In such embodiment, operations initiated by applications with a lower priority may be subject to the delay, while operations initiated by applications with a higher priority may not necessarily be subject to the delay (when possible).

Of course, other embodiments are contemplated where the delay is administered across operations in an application-independent manner. For example, the delay may be applied to all operations of a certain type (e.g. an erase operation, etc.) irrespective of the originating application. Still yet, embodiments involving a hybrid approach are also contemplated.

Even still, embodiments are contemplated where the delayed operation may include an operation or a pattern of operations causing an unusual reduction in lifetime. In one embodiment, only these patterns may be delayed. For example, virus or rough application operation patterns may be detected, and only operations from such patterns may be delayed.

Figure 3:
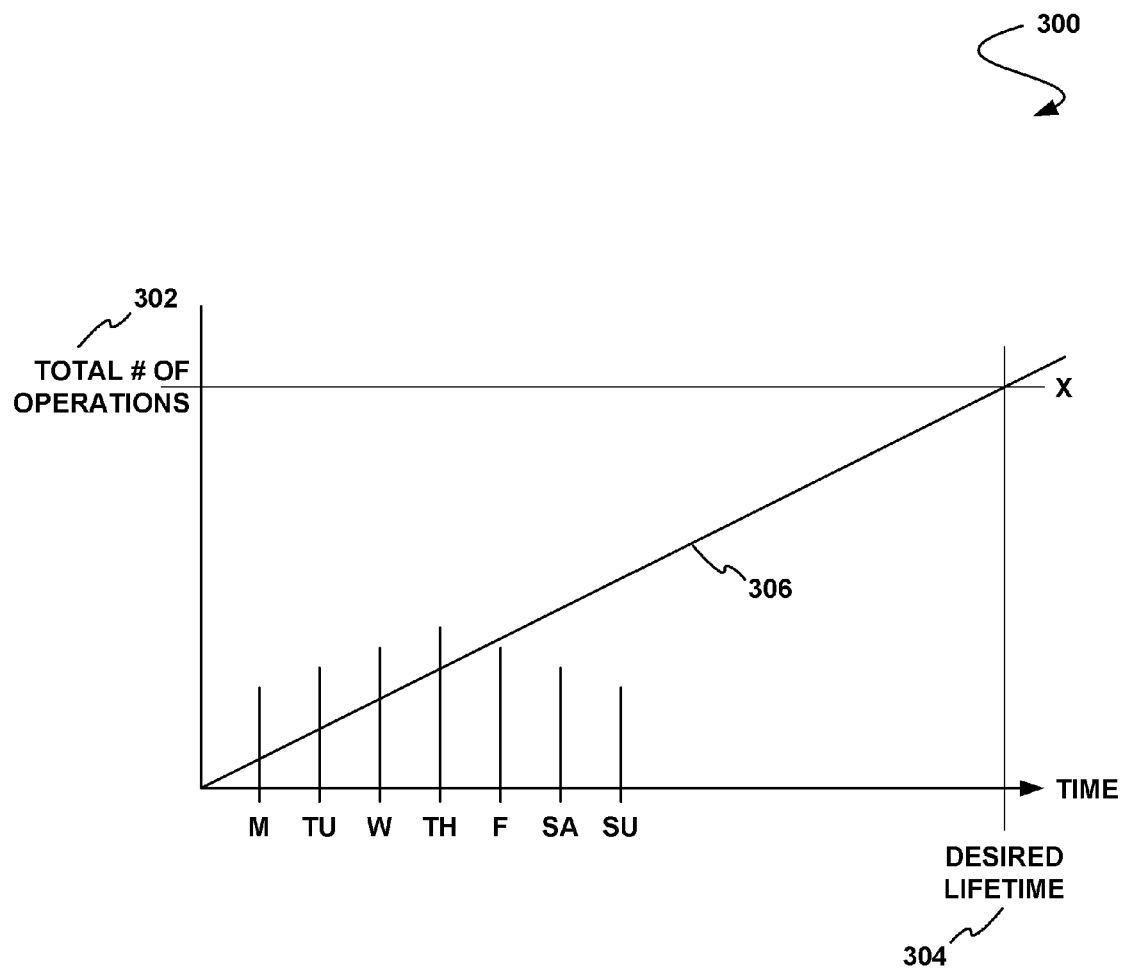
FIG. 3 shows a time interval-based technique for delaying operations that reduce a lifetime of memory, in accordance with yet another embodiment.

FIG. 3 shows a time interval-based technique 300 for delaying operations that reduce a lifetime of memory, in accordance with yet another embodiment. As an option, the present technique 300 may be implemented to carry out the method 100 of FIG. 1 and/or further in the context of the technique 200 of FIG. 2. Of course, however, the technique 300 may be implemented in any desired environment. Again, it should also be noted that the aforementioned definitions may apply during the present description.

Similar to the technique of FIG. 2, the technique 300 takes into account a total number of operations 302 that result in the memory exhibiting a minimal degree of usability, as well as a minimum desired lifetime 304 of the memory. From such data points, a maximum average operation rate 306 may be calculated that achieves the minimum desired lifetime 304. In use, a number of lifetime-reducing operations may be monitored as time progresses.

If at any time, a number of such operations over time exceeds the maximum average operation rate 306, in the manner shown, any excess operations are not necessarily delayed in an unconditional manner (like the technique 200 of FIG. 2). Instead, such excess operations may be conditionally delayed based on a time interval during which the operation is initiated. Such time interval, for example, may include, but is not limited to a time of the day, a day of the week, a month of the year, etc. In additional embodiments, the time interval may be adaptively and dynamically adjusted to an optimal period. For example, such adaptive and dynamic adjustment may be based on histograms of frequencies of lifetime-reducing operations over subintervals of an interval, etc.

For example, if an excess number of operations is identified on a Monday, Tuesday, Wednesday, Thursday, etc. in the manner shown, it may be recognized (e.g. anticipated) that the number of operations likely to be identified during the subsequent Friday, Saturday, and Sunday will be less. Thus, instead of unconditionally delaying such excess number operations, they may be performed immediately, relying upon the likelihood that the average operation rate (when taken over the week) will not exceed the maximum average operation rate 306. Of course, if this does not turn out to be the case, some delaying may occur during a subsequent week, etc. While the foregoing example has been set forth in the context of days during a week, other more "macro" embodiments are contemplated that take into account fluctuations of memory use over weeks of the month, months of the year, etc.

In still additional embodiments, the conditional delaying of the operations may be generalized so as not to be necessarily interval-based, but instead be based on historical use of the memory, and/or even predicted use of the memory. In such embodiments, any desired statistical analysis may be performed using historical data for the purpose of predicting future use, more accurately identifying situations where delaying excess operations need not necessarily occur, etc.

Figure 4:
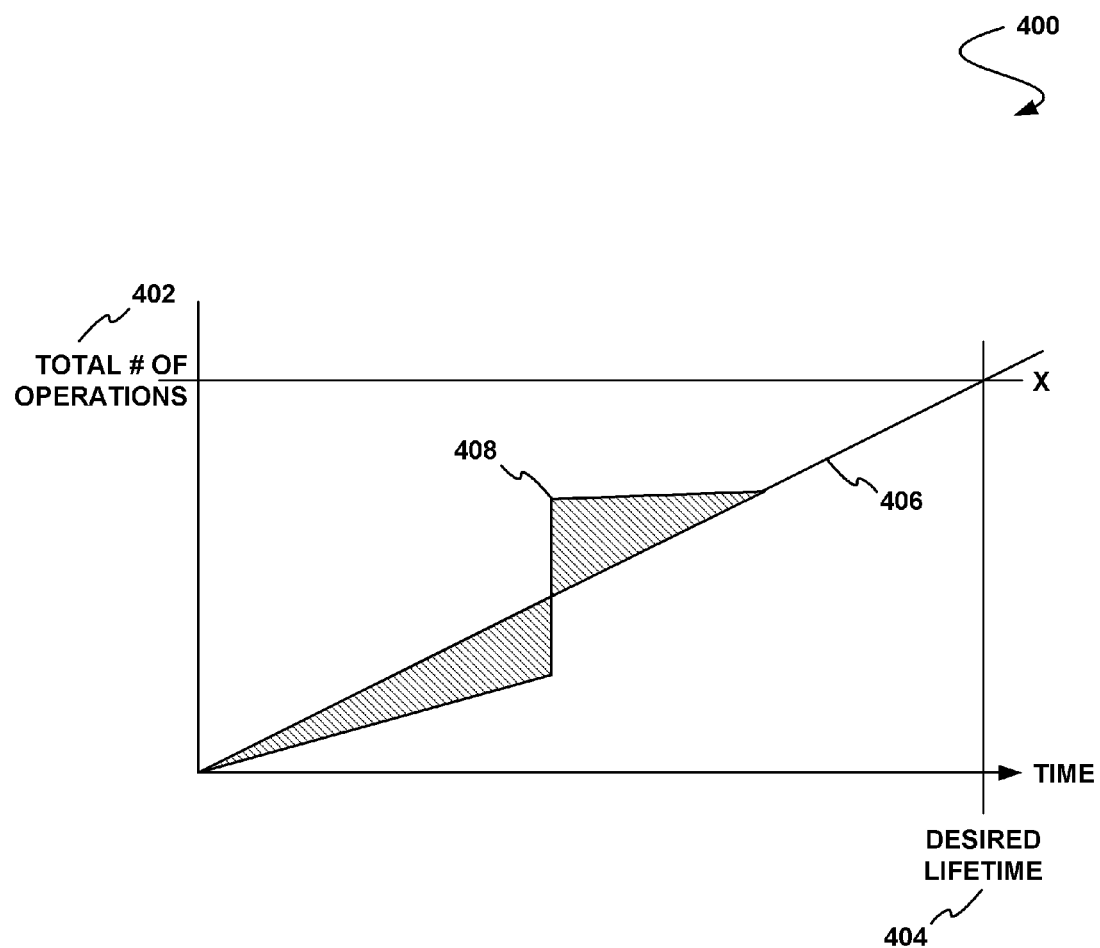
FIG. 4 shows an integration-based technique for delaying operations that reduce a lifetime of memory, in accordance with still yet another embodiment.

FIG. 4 shows an integration-based technique 400 for delaying operations that reduce a lifetime of memory, in accordance with still yet another embodiment. As an option, the present technique 400 may be implemented to carry out the method 100 of FIG. 1 and/or further in the context of the techniques 200 and 300 of FIGS. 2-3. Of course, however, the technique 400 may be implemented in any desired environment. Again, it should also be noted that the aforementioned definitions may apply during the present description.

Similar to the previous techniques, the technique 400 takes into account a total number of operations 402 that result in the memory exhibiting a minimal degree of usability, as well as a minimum desired lifetime 404 of the memory. From such data points, a maximum average operation rate 406 may be calculated that achieves the minimum desired lifetime 404. In use, a number of lifetime-reducing operations may be monitored as time progresses.

If at any time, a number of such operations over time exceeds the maximum average operation rate 406, in the manner shown (see 408), any excess operations are not necessarily delayed in an unconditional manner (like the technique 200 of FIG. 2). Instead, such excess operations may be conditionally delayed based on an integral function reflecting use of the memory. In particular, an integral of a difference between the overall rate of lifetime-reducing operations over time, and the maximum average operation rate 406 may be calculated on an on-going basis. To this end, if such integration indicates that such operations may exceed maximum average operation rate 406, the aforementioned delaying need not necessarily occur.

Figure 5:
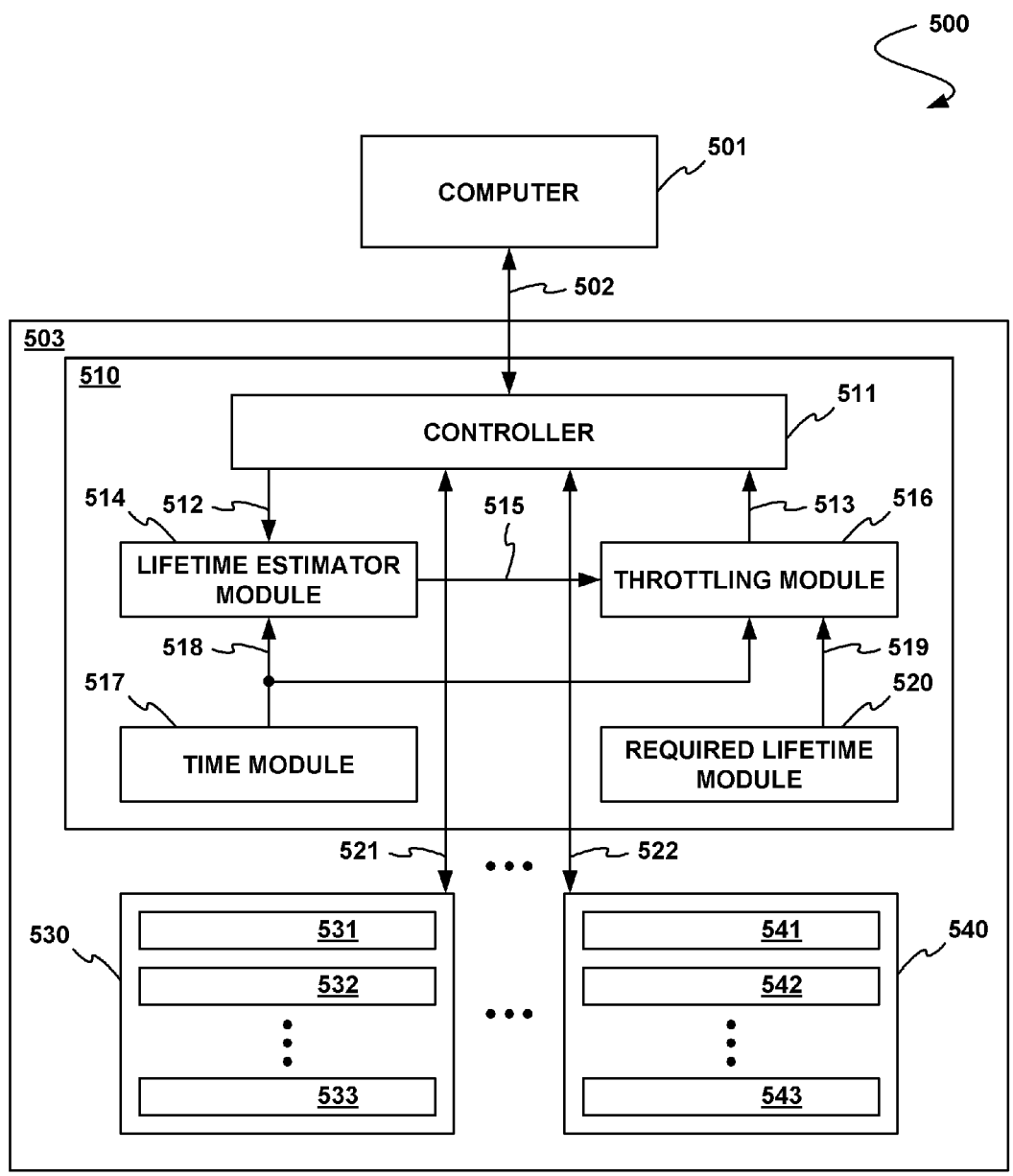
FIG. 5 illustrates a system for delaying operations that reduce a lifetime of memory, if a desired lifetime duration exceeds an estimated lifetime duration, in accordance with another embodiment.

FIG. 5 illustrates a system 500 for delaying operations that reduce a lifetime of memory, if a desired lifetime duration exceeds an estimated lifetime duration, in accordance with another embodiment. As an option, the present system 500 may be implemented to carry out the method 100 of FIG. 1 and/or further optionally incorporate any of the techniques of FIGS. 2-4. Of course, however, the system 500 may be used in any desired manner.

As shown, included is a storage system 503 that comprises a plurality of storage devices 530, 540. At least one storage bus 502 couples at least one controller 511 with at least one computer 501. In various embodiments, the storage bus 502 may include, but is not limited to a serial advanced technology attachment (SATA) bus, serial attached SCSI (SAS) bus, fiber channel bus, memory bus interface, flash memory bus, NAND flash bus, integrated drive electronics (IDE) bus, advanced technology attachment (ATA) bus, consumer electronics (CE) bus, universal serial bus (USB) bus, smart card bus, multimedia card (MMC) bus, etc. Thus, the controller 511 is capable of being coupled between a system (e.g. computer 501) and secondary storage (such as at least one of the storage devices 530, 540). Further included is at least one apparatus 510 for prolonging a lifetime of memory associated with the storage devices 530, 540.

As shown, the apparatus 510 includes a controller 511 coupled to the storage devices 530, 540 via a plurality of corresponding buses 521, 522, respectively. The controller 511 uses a plurality of buses 521, 522 to control and exchange data with a plurality of storage devices 530, 540 in order to execute commands received from the computer 501 via the storage bus 502. The storage devices 530, 540 each include at least one module or block 531, 532, 533, 541, 542, 543 for storing data. Further, at least a portion of the aforementioned commands are lifetime-reducing commands that have a negative impact on at least one module or block 531, 532, 533, 541, 542, 543. In use, the apparatus 510 serves for prolonging the lifetime of the storage devices 530, 540, despite such lifetime-reducing commands.

To accomplish this, the controller 511 is coupled to a lifetime estimator module 514 via a corresponding bus 512. The apparatus 510 further includes a time module 517 coupled to the lifetime estimator module 514 via a bus 518, for providing a current time. In use, the lifetime estimator module 514 serves to receive commands communicated to the controller 511 from the computer 501 via the storage bus 502. Further, the lifetime estimator module 514 computes an estimated lifetime assuming that the command(s) received through the bus 512 was executed.

With continuing reference to FIG. 5, the lifetime estimator module 514 is coupled to a throttling module 516 via a bus 515. The lifetime estimator module 514 uses the bus 515 to pass to the throttling module 516 the estimated lifetime for a command currently executed by the controller 511. The currently executed command may, in one embodiment, be the same as that received by the lifetime estimator module 514 via the bus 512 and may further be the same as that received by the controller 511 from the computer 501 via the storage bus 502.

The current time module 517 is also coupled to the throttling module 516 via the bus 518. Thus, the current time from the current time module 517 may be passed to the throttling module 516 as well. In one embodiment, the current time module 517 may be implemented, for example, as a simple counter incrementing at a constant time interval, etc.

The throttling module 516 is further coupled with a required lifetime module 520 via a bus 519, as well as to the controller 511 via a bus 513. In use, the required lifetime module 520 is adapted for storing a desired lifetime. By this design, the throttling module 516 may be configured to pass information to the controller 511 via the bus 513 to instruct the controller 511 to delay the execution of the current command.

In one embodiment, the throttling module 516 of the apparatus 510 may operate such that the execution of the current command is delayed until the effects of the execution on the lifetime is such that the estimated lifetime is longer or the same as the required lifetime stored in the required lifetime module 520. The functionality of the throttling module 516 may, in one embodiment, be as simple as providing a delay signal to the controller 511, if the estimated lifetime received via the bus 515 is shorter than the required lifetime received via the bus 519.

In another embodiment, the above-described functions of the controller 511, the lifetime estimator module 514, and the throttling module 516 may be applied to a group of commands received in predefined time intervals. Such arrangement may allow the system 500 to meet the required lifetime without unnecessarily throttling short bursts of commands that would otherwise reduce lifetime. By choosing the time interval, for example, as being one day, such a technique allows the system 500 to provide higher instantaneous performance for lifetime-reducing commands because, during some period of the day (e.g. nighttime, etc.), there may be intervals of time where there is a reduced frequency of lifetime-reducing commands compared to an average frequency of lifetime-reducing commands.

In one optional embodiment, coherency may be maintained over time. As an example of a coherency method, if lifetime-reducing command A is delayed, then all commands (lifetime-reducing or not) that depend on the data of A or the values resulting from the execution of the command A are also delayed.

In another embodiment, time may be replaced with various approximations of time, such as time that a disk is being powered up. In another embodiment, the computer 501, a RAID controller, and/or other device may provide additional information to increase precision of time tracked. Thus, when one or more of the storage devices 530, 540 is turned off, the time counter is not counting. Since real time is advancing, this may unnecessarily reduce performance. In such scenario, the computer 501, software, and/or a controller may provide information about the time when the system 500 is turned off, for addressing such issue.

In another embodiment, the system 500 may be equipped with an intra-storage device redundancy capability for reducing cost and improving performance. In such embodiment, data may be moved between the individual storage devices 530, 540, based on any aspect associated with a lifetime thereof (e.g. see, for example, operation 102 of FIG. 1, etc.). For instance, a situation may involve a first one of the storage devices 530 including a set of data that is more frequently overwritten with respect to the data of a second one of the storage devices 540. In such case, after a predetermined amount of time, such data may be moved from the first storage device 530 to the second storage device 540, and henceforth the first storage device 530 or one or more blocks/modules 531, 532, 533 thereof may be used to store less-frequently written data or retired from further use.

To this end, storage device wear may be distributed appropriately to avoid one storage device from failing at a point in time that is vastly premature with respect to other storage devices of the group. Of course, the present technique may be applied not only among different storage devices, but also portions thereof. To this end, the lifetime of any memory components may be managed in such a manner.

In any case, the controller 511 may thus be equipped for reducing and/or distributing writes. By this feature, a lifetime of the appropriate storage devices 530, 540 may be prolonged. One exemplary method for carrying out such technique will now be set forth during the description of FIG. 6.

Figure 6:
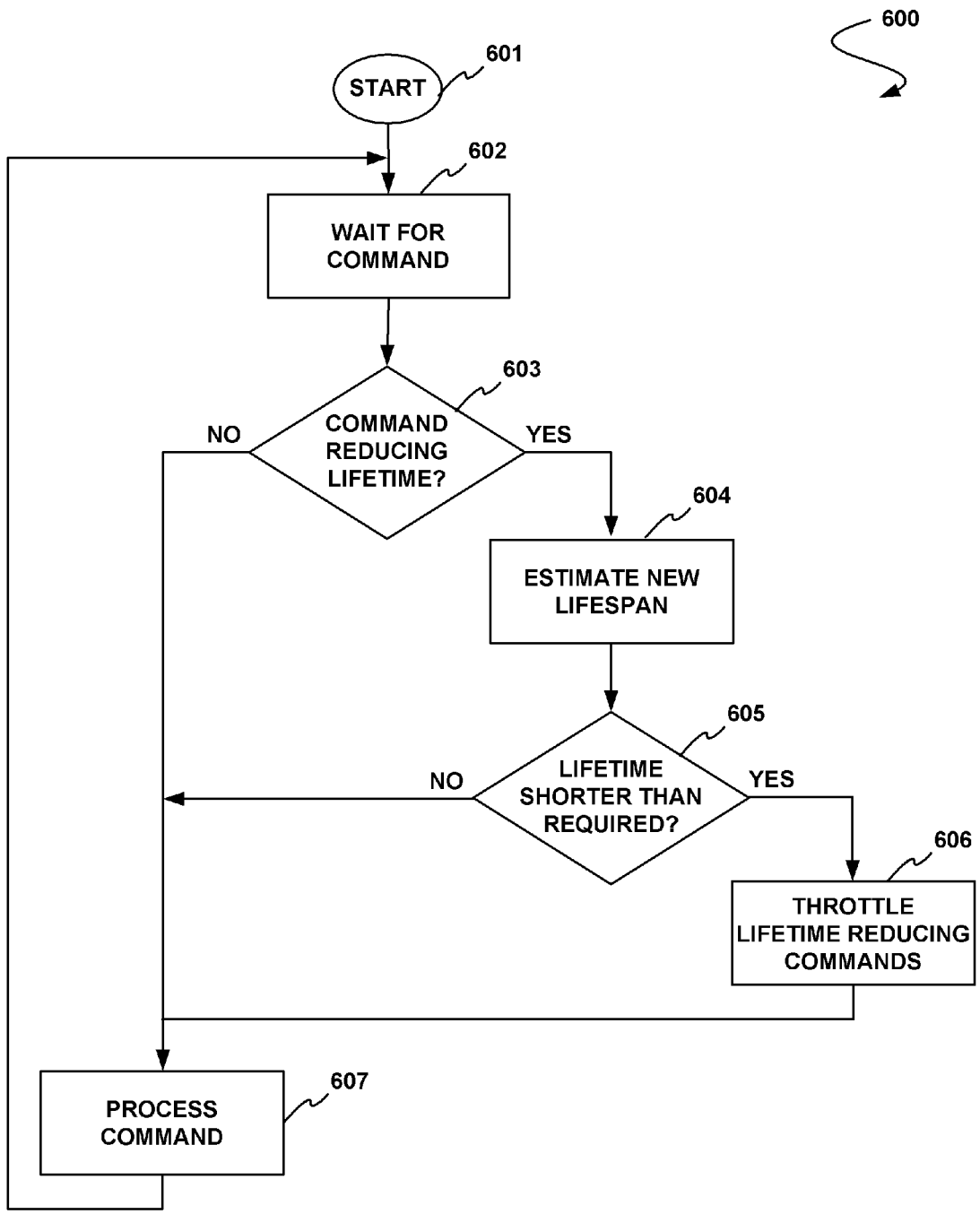
FIG. 6 illustrates a method for delaying operations that reduce a lifetime of memory, if a desired lifetime duration exceeds an estimated lifetime duration, in accordance with another embodiment.

FIG. 6 illustrates a method 600 for delaying operations that reduce a lifetime of memory, if a desired lifetime duration exceeds an estimated lifetime duration, in accordance with another embodiment. As an option, the present method 600 may be carried out using the system 500 of FIG. 5 and/or further optionally incorporate any of the techniques of FIGS. 1-4. Of course, however, the method 600 may be used in any desired manner. Still yet, the aforementioned definitions may apply during the present description.

Upon starting operation 601, the method 600 continues by a controller (e.g. controller 511 of FIG. 5, etc.) awaits a command 602 issued by a computer (e.g. computer 501, etc.) to at least one storage device (e.g. storage device 530, 540, etc.). Once the command is received by the controller, the method proceeds to decision 603, when the controller determines if the command accepted in operation 602 is a lifetime-reducing command (e.g. an erase operation, a write operation, etc.). If it is determined in decision 603 that the currently received command is not lifetime-reducing, such command may be simply processed per operation 607.

On the other hand, if it is determined in decision 603 that the currently received command is indeed lifetime-reducing, an estimated lifetime is computed by a lifetime estimator module (e.g. lifetime estimator module 514, etc.) based on the command received in operation 602, a previous lifetime, and a current time (e.g. via time module 517, etc.). See operation 604. In one embodiment, the previous lifetime may represent a previous state of the lifetime estimator module. In another embodiment, the previous lifetime may be obtained by measuring one or more properties of at least one storage device.

In any case, the lifetime estimated by such lifetime estimator module is then provided to a throttling module (e.g. throttling module 516, etc.). In decision 605, the throttling module determines that throttling is necessary if the estimated lifetime received from the lifetime estimator is shorter than the required lifetime sent to the throttling module. If throttling is necessary, the method 600 proceeds in operation 606 by delaying (e.g. throttling, etc.) the lifetime-reducing command. However, if the estimated lifetime is not shorter than the required lifetime, the method 600 proceeds in operation 607, as set forth above.

Specifically, in operation 606, the throttling module may throttle execution of the lifetime-reducing commands using the controller. In one embodiment, such throttling may be implemented by delaying execution of the lifetime-reducing command using the controller, until the lifetime estimated by the lifetime estimator is longer or the same as the required lifetime.

In another embodiment, the throttling may be determined in predetermined periods of time and applied to commands in a subsequent predetermined time period. In such embodiment, a limit may be applied as to how much lifetime may be shortened within a predetermined time interval. In yet another embodiment, a limit as to how much a lifetime may be shortened within a time interval may be determined in one or more previous time intervals. In yet another embodiment, the throttling may be determined based on an analysis of a plurality of pending operations, allowing non-lifetime-reducing operations to be performed ahead of lifetime-reducing operations or operations that depend on such lifetime-reducing operations.

By this design, a data storage system may be provided that controls lifetime-reducing operations to guarantee a required minimal lifetime. The impact of lifetime-reducing operations on such minimal required lifetime may thus be estimated, and a frequency of the lifetime-reducing operations may be adaptively constrained.

Figure 7:
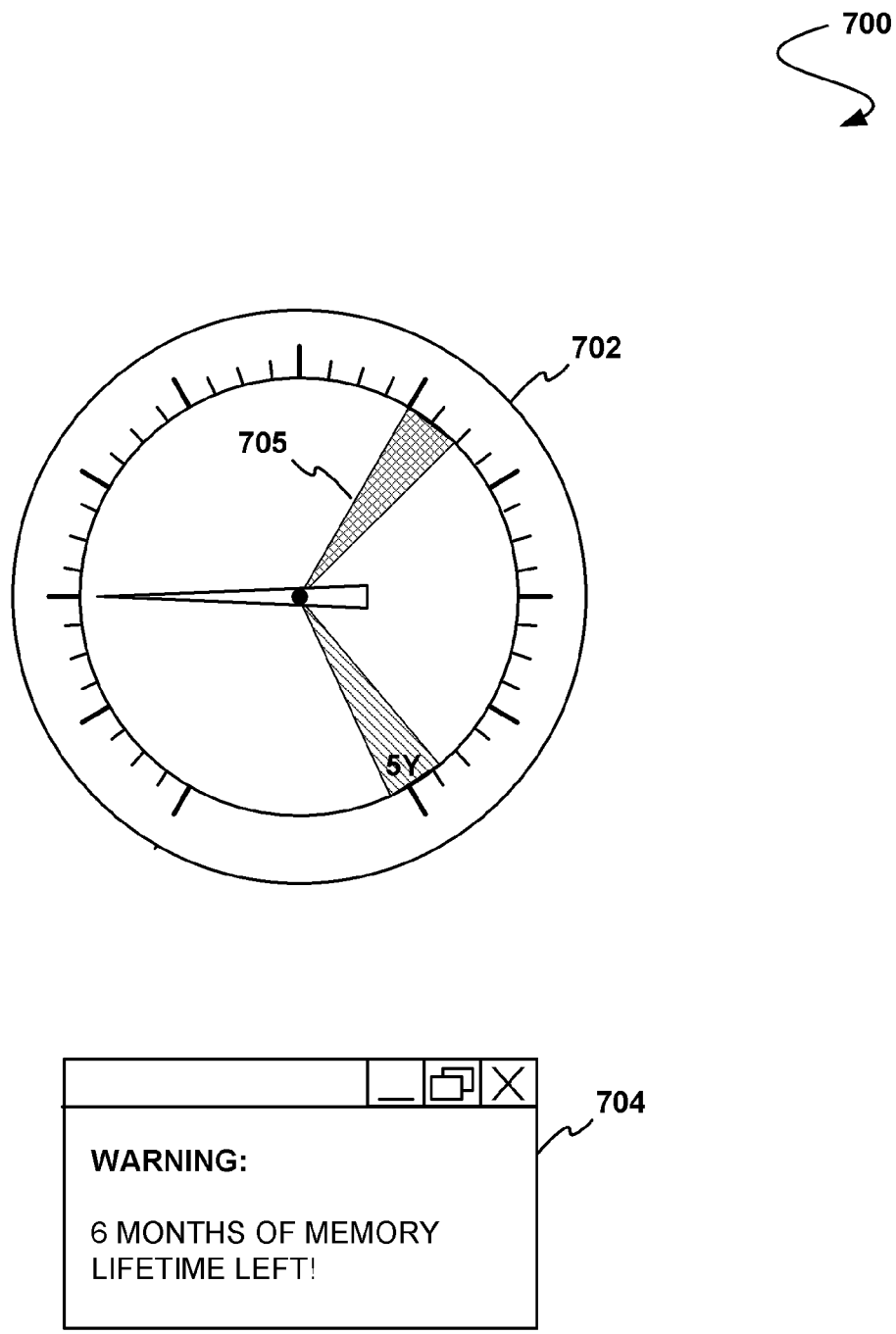
FIG. 7 shows a graphical user interface for gauging a lifetime of memory, in accordance with another embodiment.

FIG. 7 shows a graphical user interface 700 for gauging a lifetime of memory, in accordance with another embodiment. As an option, the present graphical user interface 700 may be implemented in the context of the functionality and architecture of FIGS. 1-6. Of course, however, the graphical user interface 700 may be used in any desired environment. Again, it should also be noted that the aforementioned definitions may apply during the present description.

As shown, various indicia may be displayed reflecting at least one aspect associated with a lifetime of memory. In one embodiment, such aspect may be that identified in operation 102 of FIG. 1. Of course, however, this lifetime-related aspect may include any desired aspect that is at least partially related to the lifetime of the memory. For instance, in the context of the system 500 of FIG. 5, the aspect may be retrieved by the controller 511 from any of the modules shown for being processed and/or simply passed to the computer 501 which may, in turn, display associated indicia under the control of a software application program (e.g. plug-in, etc.).

For example, the aforementioned indicia may, in one embodiment, include a gauge 702 for indicating an amount of lifetime remaining for one or more memories. In such embodiment, the gauge 702 may indicate an amount of total memory lifetime remaining as a function of the number of lifetime-reducing operations that have been performed over time. In yet another embodiment, the aforementioned indicia may include a estimation 705 for indicating a lifetime based on extrapolation of prior usage and assuming suspension of throttling operations.

In another embodiment, the aforementioned indicia may include a warning 704 for indicating that a minimum amount of lifetime remains for one or more memories. Such lifetime may be estimated, for example, based on historical memory usage data. By this design, a user may be warned of a situation where memory should be replaced within a predetermined amount of time, etc. Of course, other embodiments are contemplated where any desired indicia is used to report various information in association with a lifetime of memory.

Figure 8:
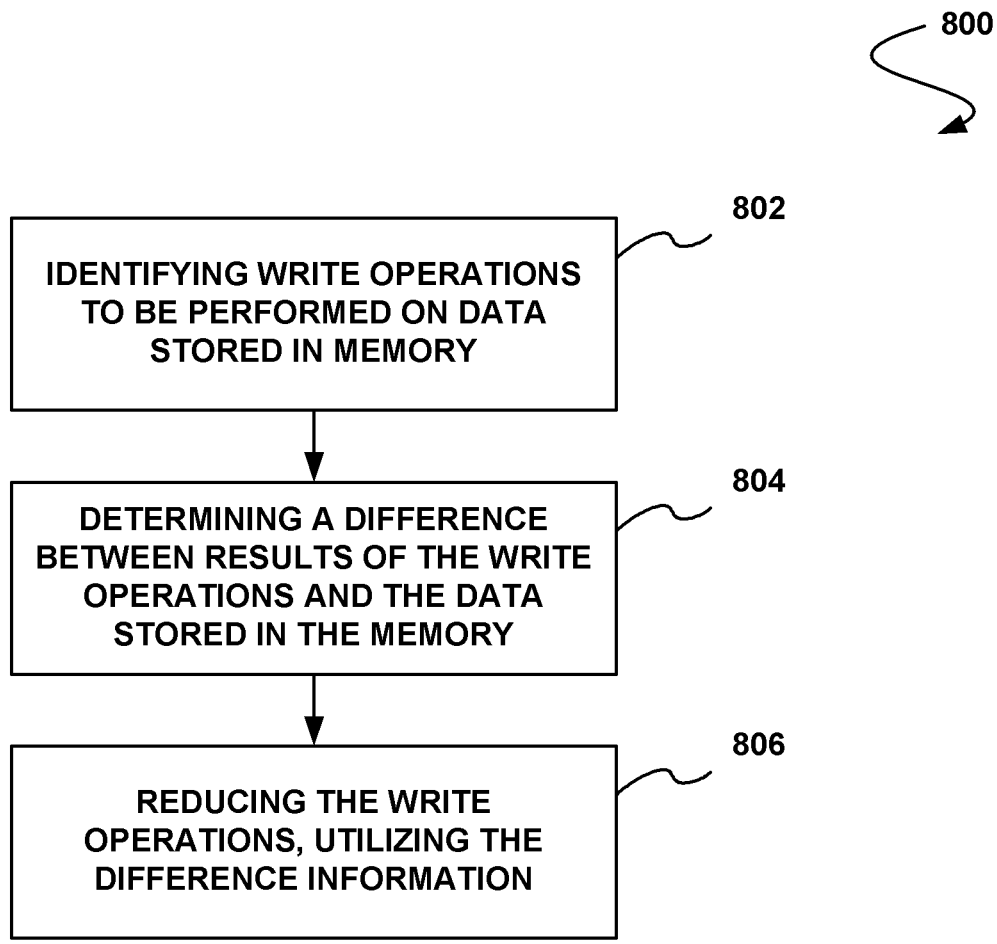
FIG. 8 shows a method for reducing write operations in memory, utilizing difference information, in accordance with another embodiment.

FIG. 8 shows a method 800 for reducing write operations in memory, utilizing difference information, in accordance with another embodiment. As an option, the present method 800 may or may not be carried out in conjunction with the functionality and architecture of FIGS. 1-7. Of course, however, the method 800 may be carried out in any desired environment. It should also be noted that the aforementioned definitions may apply during the present description.

As shown, write operations to be performed on data stored in memory are identified. See operation 802. In the context of the present description, such write operations may include any operations that result in the data stored in the memory being modified. Further, such write operations may be identified in any desired manner by intercepting write commands associated such operations, the write operations themselves, etc.

As indicated in operation 804, a difference is then determined between results of the write operations and the data stored in the memory. In the context of the present description, the aforementioned difference may reflect, at least in part, any difference between a first state of the data stored in the memory, and a second state that would result from the foregoing write operations.

In another embodiment, a difference may be determined between any data stored in the memory. For example, a new modified version of a file may be created and written to a new location in the memory, such that a difference in data from different locations in the memory may be determined. As an option, the location of the data may be identified based on a hash, bloom filters, etc. To this end, in one exemplary embodiment where different instances of the same data are written to different locations in the memory, the determined difference may include the location of the data, and not necessarily the data itself.

In one embodiment, difference information associated with the difference may be stored in the memory (e.g. the same memory in which the data is stored, etc.). In another embodiment, the difference information may also be stored in a separate buffer, in a manner that will be elaborated upon later during the description of a different embodiment. It should be noted that the difference information may include any information that describes, at least in part, the difference determined in operation 804. As will soon become apparent during the discussion of a later described embodiment, the difference information may, in one embodiment, be stored utilizing an instruction set. As also described below, such instruction set may adaptively change and/or dynamically expand, in various embodiments.

To this end, the write operations may be reduced, utilizing the difference information. See operation 806. By this design, such reduction in write operations may optionally result in a prolonged lifetime of the memory.

More illustrative information will now be set forth regarding various optional architectures and features with which the foregoing framework may or may not be implemented, per the desires of the user. For example, one exemplary system will be set forth for implementing one illustrative way of reducing the write operations based on the difference information. It should be strongly noted that the following information is set forth for illustrative purposes and should not be construed as limiting in any manner. Any of the following features may be optionally incorporated with or without the exclusion of other features described.

Figure 9:
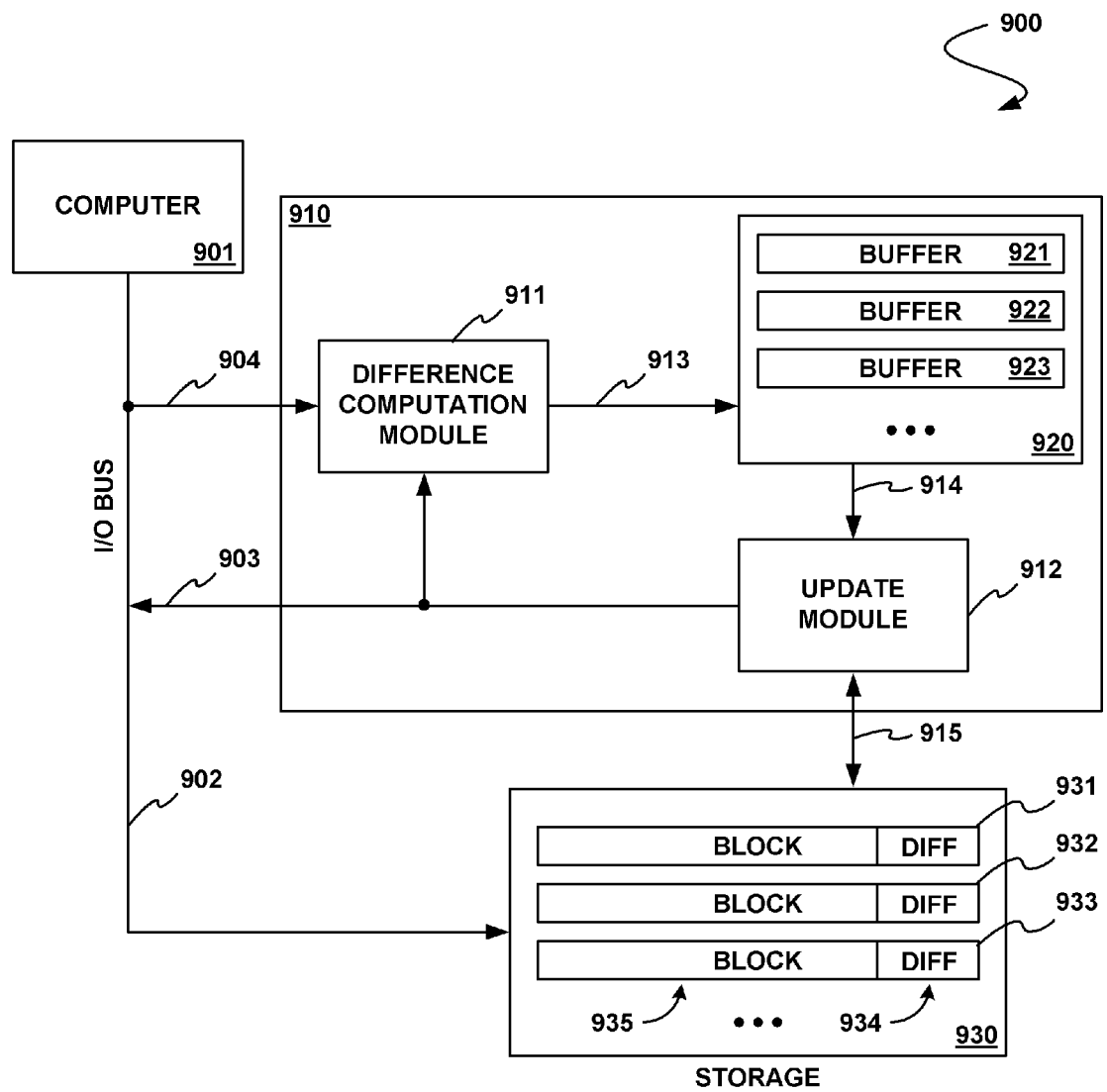
FIG. 9 illustrates a system for reducing write operations in memory, in accordance with another embodiment.

FIG. 9 illustrates a system 900 for reducing write operations in memory, in accordance with another embodiment. As an option, the present system 900 may be implemented to carry out the method 800 of FIG. 8 and/or further optionally incorporate any of the methods or techniques of FIGS. 1-7. Of course, however, the system 900 may be used in any desired manner. Yet again, the aforementioned definitions may apply during the present description.

As shown, the system 900 includes a computer 901 coupled to a storage device 930 via an input/output (I/O) bus 902, in a manner that will soon be set forth. The I/O bus 902 includes a read path 903 and a write path 904. The storage device 930 includes a plurality of storage blocks 931, 932, 933. The storage blocks 931, 932, 933 are written and read by the computer 901.

For reasons that will soon become apparent, a predetermined portion 934 of each of the storage blocks 931, 932, 933 may be allocated to store difference information that reflects any changes made to data stored in the remaining portion 935 of the corresponding storage block 931, 932, 933 by the computer 901. In various embodiments, a size of the predetermined portion 934 may be user configured. Further, the difference information stored therein may take any form.

Table 1 illustrates one possible format for representing an instance of difference information (a plurality of which may be stored in each predetermined portion 934 of the storage blocks 931, 932, 933).

TABLE 1

| Operation Code | Source Starting Address | Size | Data |
| --- | --- | --- | --- |
| END | N/A | N/A | N/A |
| Replace | <address> | <byte length> | <replacement data> |
| Move Up | <address> | <byte length> | <address from where data is to be moved> |
| Move Down | <address> | <byte length> | <address from where data is to be moved > |
| Insert | <address> | <byte length> | <data to be inserted> |
| Delete | <address> | <byte length> | N/A |

In the present embodiment, the operation code may represent an operation to be performed on the data stored in the remaining portion 935 of the corresponding storage block 931, 932, 933. Examples of such operations may include, but are not limited to end, replace, move up, move down, delete, insert, and/or any other operation, for that matter. As an option, such operations may each have an associated code for compact representation, (e.g. replace='001', move up='010', etc.).

Further, the source starting address and size may point to and indicate the size (respectively) of the data stored in the remaining portion 935 of the corresponding storage block 931, 932, 933 which is to be the subject of the operation. Even still, in a situation where the operation mandates a replacement/modification of data, etc., data itself may be stored as a component of the difference information. As yet another option, a compression algorithm may be applied to the difference information for more efficient storage. As another option, in a situation where the operation mandates a move of the data, a source location of the data may be designated, and not necessarily the data itself since such data is contained in an original storage block.

In another embodiment, new operations may be adaptively created. For example, repeating sequences of a first operation may be replaced by a new second operation. Such new second operation may optionally describe a sequence of the first operation. In this way, new operations may be adaptively created such that the system 900 may optimally adapt itself to new applications.

Of course, the data structure of Table 1 is set forth for illustrative purposes only and should not be construed as limiting in any manner whatsoever. For example, an instance of difference information may simply include the data to be replaced (without any complex commands, etc.).

Further provided is an apparatus 910 for reducing write operations in memory. Such apparatus 910 includes a coalescing memory 920 including a plurality of coalescing buffers 921, 922, 923. In one embodiment, a size of each of the coalescing buffers 921, 922, 923 may be of a predetermined size (e.g. 4 Kb, etc.) that may correlate with a minimum block portion that may be written to each of the storage blocks 931, 932, 933 in a single operation. Further, in various embodiments, the coalescing buffers 921 may include on-chip storage, external memory, DRAM, SRAM, etc.

As will soon become apparent, the coalescing memory buffers 921, 922, 923 each hold an instance of difference information (e.g. see Table 1, for example) for the corresponding storage blocks 931, 932, and 933. In other words, a first one of the coalescing memory buffers 921 holds an instance of difference information for a first one of the storage blocks 931, a second one of the coalescing memory buffers 922 holds an instance of difference information for a second one of the storage blocks 932, a third one of the coalescing memory buffers 923 holds an instance of difference information for a third one of the storage blocks 933, and so on.

The apparatus 910 further includes an update module 912 coupled to the coalescing memory 920 via a bus 914 for writing the difference information stored in the coalescing memory buffers 921, 922, 923 to the corresponding storage blocks 931, 932, and 933. In one embodiment, such write may be initiated upon one of the coalescing memory buffers 921, 922, 923 being filled with at least one instance of difference information (and thus constituting a minimum write size to the appropriate one of the storage blocks 931, 932, and 933). To accomplish this write, the update module 912 is coupled to the storage device 930 via a bus 915. As further shown, an output of the update module 912 is coupled to the I/O bus 902 via the read path 903.

Even still, a difference computation module 911 is coupled to the update module 912 via the read path bus 903, coupled to the I/O bus 902 via the write path bus 904, and further coupled to the coalescing memory 920 via a bus 913. In use, the difference computation module 911 is capable of reading data from the storage device 930 and further reconstructing a current state of such data using the difference information from the associated storage block 931, 932, and 933; and/or coalescing memory buffers 921, 922, 923.

The difference computation module 911 is further capable of writing data to the storage device 930 by first reconstructing a current state of such data (similar to the read operation above), identifying a difference between such current state and a state that would result after a write operation (initiated by the computer 901), and populating the coalescing memory buffers 921, 922, 923 with one or more instances of difference information to be used to update the associated storage block 931, 932, and 933, as appropriate. More information regarding such read and write operations will now be set forth during the description of FIGS. 10 and 11.

In various embodiments, the difference computation module 911 may employ any desired technique for identifying the aforementioned difference(s). For example, various string matching algorithms, data motion estimation techniques, etc. may be utilized, for example. In still additional embodiments, the differences may be determined on a byte-by-byte basis.

Further, computation of the difference may involve any one or more of the following: finding what byte strings are inserted, finding what byte strings are deleted, finding what byte strings are replaced, finding what byte strings are copied, determining if byte strings are updated by adding values, finding copies of storage blocks and creating references to them, finding block splits, finding block merges, etc.

Figure 10:
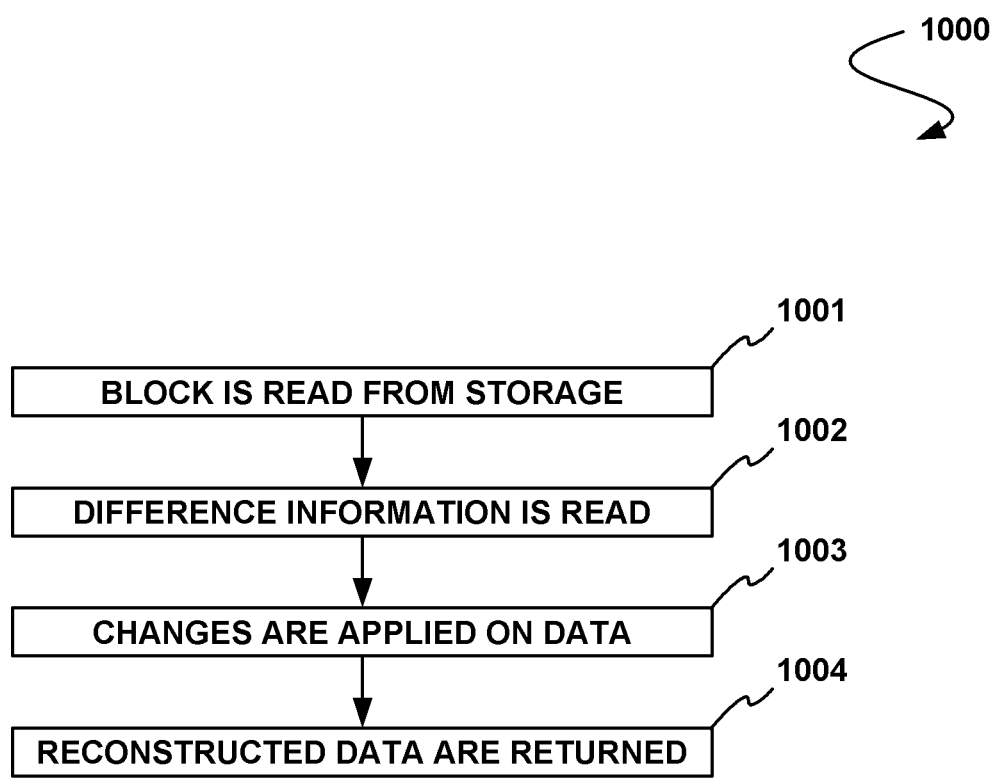
FIG. 10 illustrates a method for reading memory using difference information, in accordance with one embodiment.

FIG. 10 illustrates a method 1000 for reading memory using difference information, in accordance with one embodiment. As an option, the present method 1000 may be carried out using the system 900 of FIG. 9 and/or further optionally incorporate any of the techniques of FIGS. 1-8, as desired. Of course, however, the method 1000 may be used in any desired manner. Still yet, the aforementioned definitions may apply during the present description.

As shown, the method 1000 may begin in operation 1001 by reading blocks (e.g. blocks 931, 932, 933 of FIG. 9, etc.) from storage (e.g. storage device 930, etc.), as requested by a computer (e.g. computer 901, etc.). The read storage blocks data are then sent to an update module (e.g. update module 912, etc.). Next, in response to the read operation, difference information is read from coalescing buffers (e.g. coalescing buffers 921, 922, 923, etc.) corresponding to the storage blocks (associated with the computer request), and/or from the storage blocks themselves. See operation 1002. The appropriate source of the difference information may depend on whether the required information has been written from the coalescing buffers to the corresponding storage blocks at the time of the read request. As an option, the difference information may be interspersed between data in flash. In addition, differences relating to particular data may be grouped into one or more groups.

Next, in operation 1003, the update module applies the differences reflected in the difference information from operation 1002 on corresponding blocks read in operation 1001. To this end, the data reconstructed in operation 1003 may be sent to the computer via a read path (e.g. read path 903, etc.). See operation 1004.

In various embodiments, the foregoing data read operation may involve mapping from a logical storage block number to a physical storage block number. Still yet, the method 1000 may further provide error detection and error correction in conjunction with the read. Such error detection and correction of read data may further include a re-read operation in an attempt to recover data, and relocate the recovered data to another storage location. For example, such relocation of recovered data may involve logical storage block translation and/or be based on error rate information of candidate storage blocks.

Figure 11:
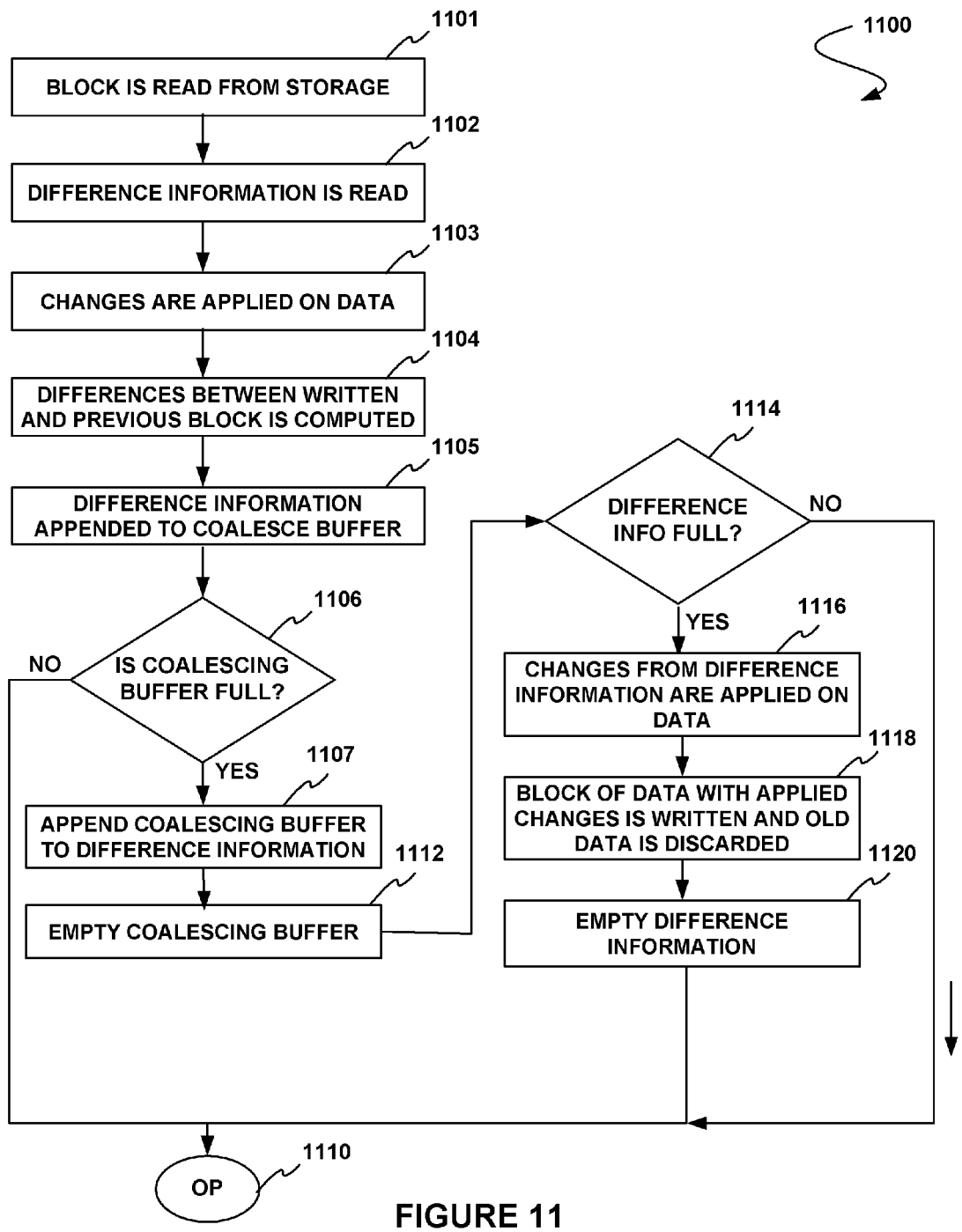
FIG. 11 illustrates a method for writing memory using difference information, in accordance with one embodiment.

FIG. 11 illustrates a method 1100 for writing memory using difference information, in accordance with one embodiment. As an option, the present method 1100 may be carried out using the system 900 of FIG. 9 and/or further optionally incorporate any of the techniques of FIGS. 1-8, 10, as desired. Of course, however, the method 1100 may be used in any desired manner. Still yet, the aforementioned definitions may apply during the present description.

Similar to the read method 1000 of FIG. 10, the method 1100 may begin in operation 1101 by reading blocks (e.g. blocks 931, 932, 933 of FIG. 9, etc.) from storage (e.g. storage device 930, etc.), which are subject to a write request by a computer (e.g. computer 901, etc.). The read storage blocks data are then sent to an update module (e.g. update module 912, etc.). Next, in operation 1102, difference information is read from the coalescing buffers (e.g. coalescing buffers 921, 922, 923, etc.) corresponding to the storage blocks (associated with the computer request), and/or from the storage blocks themselves. Next, in operation 1103, the update module applies the differences reflected in the difference information from operation 1102 on corresponding blocks read in operation 1101, to reconstruct the data to be read or written.

To this end, the data reconstructed in operation 1103 may be sent to a difference computation module (e.g. difference computation module 911, etc.) and compared with a state of the data that would result from execution of the write operation requested by the computer. See operation 1104. To this end, a difference between the reconstructed data and the state of the data that would result from execution of the write operation is identified. In one embodiment, such difference may be caused by an application (running on the computer) for updating the data. Such updates may include, but are not limited to replacing a string of bytes, inserting a string of bytes, deleting a string of bytes, copying a string of bytes, etc.

In operation 1105, difference information associated with the differences computed in operation 1104 may be appended to the appropriate coalescing buffers corresponding to blocks for which there is at least one difference computed in operation 1104. Such appending may be accomplished writing to the end of the coalesce buffers in the coalescing memory. In one embodiment, such appending may further include decompressing a coalesce buffer, appending the data, and recompressing the appropriate coalesce buffer. As an option, coalescing buffer memory may be reallocated to the coalescing buffers on demand.

In an optional embodiment, the difference information may be stored as operations describing functions (e.g. writes, etc.) performed on the data. For example, the difference information may reflect changes resultant from operations performed in a B-Tree and may thus represent differences with respect to such operations. Such B-Trees may optionally be utilized by databases, mail-servers, file systems, etc.

Next, in decision 1106, the coalesce buffers are tested to determine whether they are full. If no coalesce buffer is full, the method 1100 proceeds to operation 1110. If, on the other hand, at least one coalesce buffer is full, the method 1100 proceeds to operation 1107. In operation 1107, any full coalesce buffers are appended to the difference information. In addition, such full coalesce buffers are emptied (for reuse, etc.), as shown in operation 1112.

It is further determined whether the difference information is full (operation 1114). The method 1100 proceeds to operation 1110 if it is determined that difference information is not full. However, in response to a determination that the difference information is full, changes from the difference information are applied on the data. Note operation 1116. Moreover, the block of data with the applied changes is written and old data is discarded, as shown in operation 1118. Still yet, as shown in operation 1120, the difference information is emptied. To this end, a data storage system may be provided which uses differences between written and existing data to reduce writes and to distribute writes across memory blocks to improve reliability of block based storage.

In various embodiments, the memory mentioned in the foregoing embodiments may include a mechanical storage device (e.g. a disk drive including a SATA disk drive, a SAS disk drive, a fiber channel disk drive, IDE disk drive, ATA disk drive, CE disk drive, USB disk drive, smart card disk drive, MMC disk drive, etc.) and/or a non-mechanical storage device (e.g. semiconductor-based, etc.). Such non-mechanical memory may, for example, include volatile or non-volatile memory. In various embodiments, the nonvolatile memory device may include flash memory (e.g. single-bit per cell NOR flash memory, multi-bit per cell NOR flash memory, single-bit per cell NAND flash memory, multi-bit per cell NAND flash memory, multi-level-multi-bit per cell NAND flash, large block flash memory, etc.). While various examples of memory are set forth herein, it should be noted that the various principles may be applied to any type of memory a lifetime for which may be reduced due to various operations being performed thereon.

Figure 12:
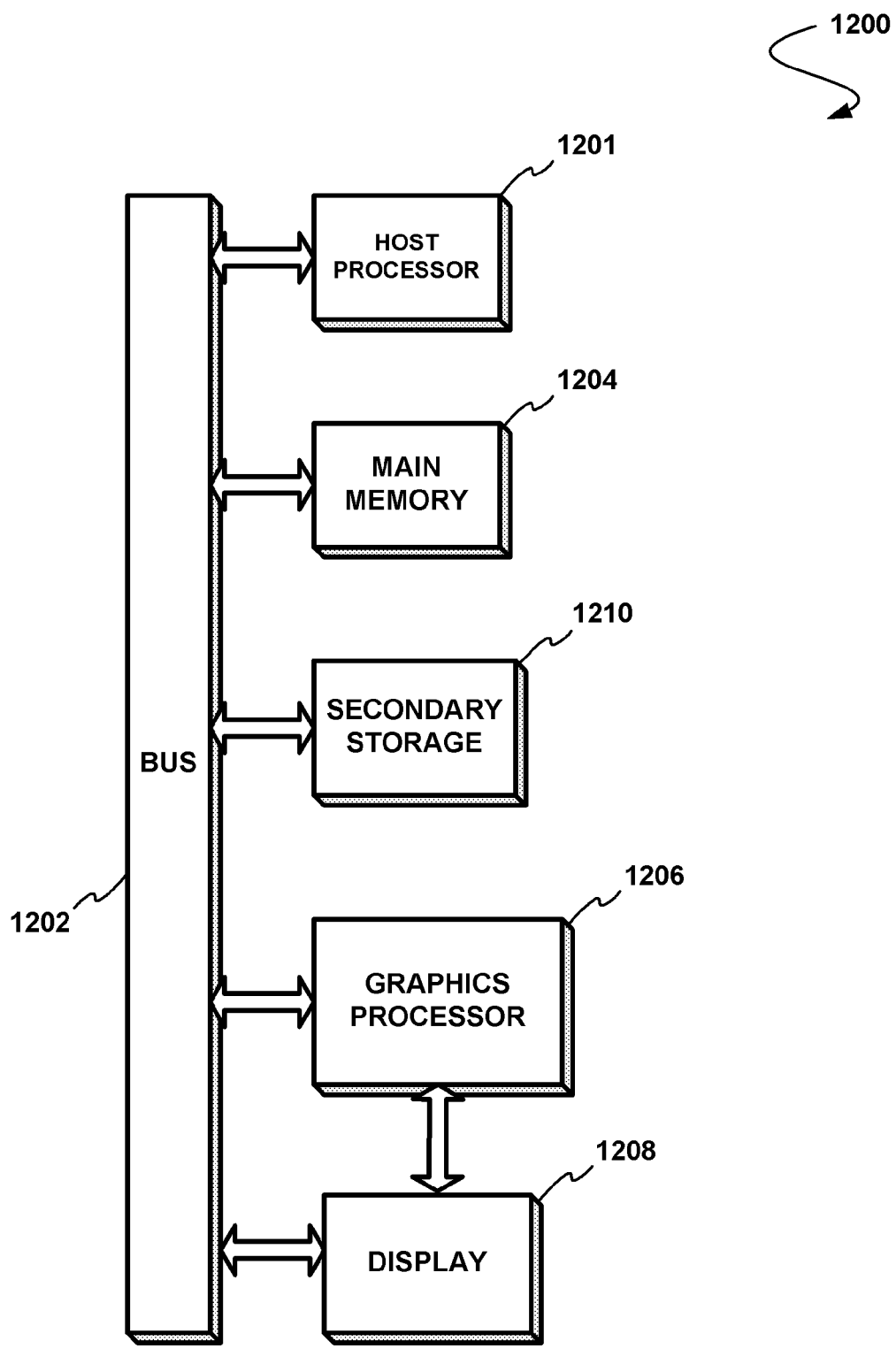
FIG. 12 illustrates an embodiment using a processor-based system.

FIG. 12 illustrates an exemplary system 1200 in which the various architecture and/or functionality of the various previous embodiments may be implemented. For example, the exemplary system 1200 may represent the computer set forth in some of the previous embodiments. Still yet, the various apparatuses set forth above may even be a component of the system 1200.

As shown, a system 1200 is provided including at least one host processor 1201 which is connected to a communication bus 1202. The system 1200 also includes a main memory 1204. Control logic (software) and data are stored in the main memory 1204 which may take the form of random access memory (RAM).

The system 1200 also includes a graphics processor 1206 and a display 1208, i.e. a computer monitor. The system 1200 may also include a secondary storage 1210. The secondary storage 1210 includes, for example, a hard disk drive and/or a removable storage drive, representing a floppy disk drive, a magnetic tape drive, a compact disk drive, etc. The removable storage drive reads from and/or writes to a removable storage module in a well known manner.

Computer programs, or computer control logic algorithms, may be stored in the main memory 1204 and/or the secondary storage 1210. Such computer programs, when executed, enable the system 1200 to perform various functions. Memory 1204, storage 1210 and/or any other storage are possible examples of computer-readable media.

In one embodiment, the architecture and/or functionality of the various previous figures may be implemented in the context of the host processor 1201, graphics processor 1206, secondary storage 1210, an integrated circuit (not shown) that is capable of at least a portion of the capabilities of both the host processor 1201 and the graphics processor 1206, a chipset (i.e. a group of integrated circuits designed to work and be sold as a module for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 1200 may take the form of a desktop computer, lap-top computer, and/or any other type of logic. Still yet, the system 1200 may take the form of various other devices including, but not limited to a personal digital assistant (PDA) device, a mobile phone device, a television, etc.

Further, while not shown, the system 1200 may be coupled to a network [e.g. a telecommunications network, local area network (LAN), wireless network, wide area network (WAN) such as the Internet, peer-to-peer network, cable network, etc.] for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An apparatus comprising:
   a difference computation module;
   one or more coalescing memory buffers;
   wherein the difference computation module is enabled to receive a command initiating an operation to be applied to storage devices, identify the operation as a write operation directed to one or more of a plurality of blocks of the storage devices, reconstruct a current state of data of the one or more blocks, compute a difference between the current state and a state that would result from the write operation, and populate at least one of the coalescing memory buffers with difference information associated with the difference and to be used to update an associated one of the blocks;

wherein the coalescing memory buffers are separate from the storage devices; and wherein the difference computation module is further enabled to determine whether the coalescing memory buffers are full, and to selectively write the difference information in the coalescing memory buffers to the storage devices, based on the determination of whether the coalescing memory buffers are full.

2. The apparatus of claim 1, wherein the command is from a host processor.

3. The apparatus of claim 2, wherein the apparatus is coupled between the host processor and the storage devices.

4. The apparatus of claim 3, further comprising at least some of the storage devices.

5. The apparatus of claim 2, wherein the apparatus is coupled between the host processor and secondary storage.

6. The apparatus of claim 1, wherein the difference information includes a location of the write operation.

7. The apparatus of claim 6, wherein the difference information does not include data of the write operation.

8. The apparatus of claim 1, wherein the difference computation module is separate from the storage devices.

9. The apparatus of claim 1, wherein at least one of the storage devices comprises flash memory.

10. An apparatus comprising:
a difference computation module;
one or more coalescing memory buffers;
wherein the difference computation module comprises
means for receiving a command initiating an operation to be applied to storage devices,
means for identifying the operation as a write operation directed to one or more of a plurality of blocks of the storage devices,
means for reconstructing a current state of data of the one or more blocks,
means for computing a difference between the current state and a state that would result from the write operation, and
means for populating at least one of the coalescing memory buffers with difference information associated with the difference and to be used to update an associated one of the blocks; and
wherein the coalescing memory buffers are separate from the storage devices; and
wherein the difference computation module further comprises means for determining whether the coalescing memory buffers are full, and to selectively write the difference information in the coalescing memory buffers to the storage devices, based on the determination of whether the coalescing memory buffers are full.

11. The apparatus of claim 10, wherein the command is from a host processor.

12. The apparatus of claim 11, wherein the apparatus is coupled between the host processor and the storage devices.

13. The apparatus of claim 12, further comprising at least some of the storage devices.

14. The apparatus of claim 11, wherein the apparatus is coupled between the host processor and secondary storage.

15. The apparatus of claim 10, wherein the difference information includes a location of the write operation.

16. The apparatus of claim 15, wherein the difference information does not include data of the write operation.

17. The apparatus of claim 10, wherein the difference computation module is separate from the storage devices.

18. The apparatus of claim 10, wherein at least one of the storage devices comprises flash memory.

\* \* \* \* \*